US012666774B2

(12) United States Patent
Masui

(10) Patent No.: US 12,666,774 B2
(45) Date of Patent: Jun. 23, 2026

(54) HIGH EFFICACY POLYCHROMIC LIGHT-EMITTING DIODE (LED)

(71) Applicant: Lumileds LLC, San Jose, CA (US)

(72) Inventor: Hisashi Masui, Newark, CA (US)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 18/650,921

(22) Filed: Apr. 30, 2024

(65) Prior Publication Data

US 2025/0338685 A1     Oct. 30, 2025

(51) Int. Cl.
| | |
|---|---|
| *G09G 5/10* | (2006.01) |
| *G09G 3/32* | (2016.01) |
| *H10H 29/10* | (2025.01) |
| *H10W 90/00* | (2026.01) |

(52) U.S. Cl.
CPC ............... *H10H 29/10* (2025.01); *G09G 3/32* (2013.01); *H10W 90/00* (2026.01); *G09G 2320/0242* (2013.01)

(58) Field of Classification Search
CPC ................. G06F 3/0446; G06F 3/0445; G06F 3/041662; G06F 2203/04102; G06F 2203/04111; G06F 2203/04112; H10K 59/40
USPC ......................................... 345/694
See application file for complete search history.

(56) References Cited

U.S. PATENT DOCUMENTS

| | | | |
|---|---|---|---|
| 6,410,942 B1 | 6/2002 | Thibeault et al. |
| 6,657,236 B1 | 12/2003 | Thibeault et al. |
| 6,821,804 B2 | 11/2004 | Thibeault et al. |
| 8,222,811 B2 | 7/2012 | Vaufrey et al. |
| 8,258,044 B2 | 9/2012 | Brun et al. |
| 8,487,340 B2 | 7/2013 | Gilet et al. |
| 8,638,032 B2 | 1/2014 | Maindron et al. |
| 8,647,957 B2 | 2/2014 | Borowik et al. |
| 8,697,548 B2 | 4/2014 | Borowik et al. |
| 8,698,396 B2 | 4/2014 | Maindron et al. |
| 8,890,111 B2 | 11/2014 | Templier et al. |
| 9,093,607 B2 | 7/2015 | Gilet et al. |

(Continued)

FOREIGN PATENT DOCUMENTS

| | | |
|---|---|---|
| DE | 102010051286 A1 | 5/2012 |
| DE | 102012109460 A1 | 4/2014 |

(Continued)

OTHER PUBLICATIONS

PCT International Search Report and Written Opinion in PCT/US2025/025684 dated Sep. 8, 2025, 14 pages.

*Primary Examiner* — Jennifer T Nguyen
(74) *Attorney, Agent, or Firm* — Servilla Whitney LLC

(57) ABSTRACT

A light-emitting diode (LED) die comprises: a plurality of pixels, each of the pixels comprising respective groups of epitaxial stacks included in a microLED comprising one or more tunnel junctions and light emitting layers of different colors, the plurality of pixels comprising: a first set of pixels configured to emit a red light; a second set of pixels configured to emit a green light; a third set of pixels configured to emit a blue light; the red light, the green light, and the blue light defining a RGB (red-green-blue) gamut; and a fourth set of pixels configured to emit a yellow light and to increase power efficiency of the device over that of a device with only RGB pixels.

19 Claims, 7 Drawing Sheets

(56) References Cited

U.S. PATENT DOCUMENTS

| | | | |
|---|---|---|---|
| 9,109,296 | B2 | 8/2015 | Metaye et al. |
| 9,112,112 | B2 | 8/2015 | Do et al. |
| 9,192,290 | B2 | 11/2015 | Spinnler et al. |
| 9,209,366 | B2 | 12/2015 | Maindron et al. |
| 9,263,633 | B2 | 2/2016 | Gilet et al. |
| 9,396,970 | B2 | 7/2016 | Gillot et al. |
| 9,422,628 | B2 | 8/2016 | Simonato et al. |
| 9,496,465 | B2 | 11/2016 | Sugimoto et al. |
| 9,507,204 | B2 | 11/2016 | Pelka et al. |
| 9,601,542 | B2 | 3/2017 | Robin et al. |
| 9,722,160 | B2 | 8/2017 | Nakabayashi |
| 9,768,350 | B2 | 9/2017 | Bavencove et al. |
| 9,887,184 | B2 | 2/2018 | Takeya et al. |
| 9,945,526 | B2 | 4/2018 | Singer et al. |
| 9,978,727 | B2 | 5/2018 | Takeya et al. |
| 9,997,688 | B2 | 6/2018 | Takeya et al. |
| 10,002,928 | B1 | 6/2018 | Raring et al. |
| 10,018,325 | B2 | 7/2018 | Kim et al. |
| 10,050,026 | B2 | 8/2018 | Takeya et al. |
| 10,068,884 | B2 | 9/2018 | Takeya et al. |
| 10,145,518 | B2 | 12/2018 | Do et al. |
| 10,804,429 | B2 | 10/2020 | Wildeson et al. |
| 10,964,845 | B2 | 3/2021 | Dimitropoulos et al. |
| 11,615,731 | B2 | 3/2023 | Schrama |
| 2009/0007895 | A1 | 1/2009 | Kenworthy |
| 2011/0151607 | A1 | 6/2011 | Landis et al. |
| 2011/0287606 | A1 | 11/2011 | Brun et al. |
| 2012/0091474 | A1 | 4/2012 | Or-bach et al. |
| 2012/0205614 | A1 | 8/2012 | Templier et al. |
| 2013/0020115 | A1 | 1/2013 | Mataye et al. |
| 2013/0112945 | A1 | 5/2013 | Gilet et al. |
| 2014/0077156 | A1 | 3/2014 | Bavencove et al. |
| 2014/0094878 | A1 | 4/2014 | Gossler et al. |
| 2014/0138719 | A1 | 5/2014 | Maindron et al. |
| 2015/0118544 | A1 | 4/2015 | Oukassi |
| 2015/0144590 | A1 | 5/2015 | Simonato et al. |
| 2015/0228873 | A1 | 8/2015 | Gebuhr et al. |
| 2015/0280060 | A1 | 10/2015 | Gilet et al. |
| 2015/0380461 | A1 | 12/2015 | Robin et al. |
| 2016/0079565 | A1 | 3/2016 | Maindron et al. |
| 2016/0190400 | A1 | 6/2016 | Jung et al. |
| 2016/0218240 | A1 | 7/2016 | Bouvier et al. |
| 2016/0293811 | A1 | 10/2016 | Hussell et al. |
| 2017/0080457 | A1 | 3/2017 | Eymery et al. |
| 2017/0098746 | A1 | 4/2017 | Bergmann et al. |
| 2017/0137645 | A1 | 5/2017 | Manceau et al. |
| 2017/0186612 | A1 | 6/2017 | Almadori et al. |
| 2017/0243860 | A1 | 8/2017 | Hong et al. |
| 2017/0293065 | A1 | 10/2017 | Kim |
| 2017/0358563 | A1 | 12/2017 | Cho et al. |
| 2017/0358724 | A1 | 12/2017 | Shichijo et al. |
| 2018/0017939 | A1 | 1/2018 | Allier et al. |
| 2018/0019369 | A1 | 1/2018 | Cho et al. |
| 2018/0019373 | A1 | 1/2018 | Lehnhardt et al. |
| 2018/0061316 | A1 | 3/2018 | Shin et al. |
| 2018/0074372 | A1 | 3/2018 | Takeya et al. |
| 2018/0090540 | A1 | 3/2018 | Von Malm et al. |
| 2018/0138157 | A1 | 5/2018 | Im et al. |
| 2018/0145059 | A1 | 5/2018 | Welch et al. |
| 2018/0149328 | A1 | 5/2018 | Cho et al. |
| 2018/0156406 | A1 | 6/2018 | Feil et al. |
| 2018/0166470 | A1 | 6/2018 | Chae |
| 2018/0174519 | A1 | 6/2018 | Kim et al. |
| 2018/0174931 | A1 | 6/2018 | Henley |
| 2018/0210282 | A1 | 7/2018 | Song et al. |
| 2018/0238511 | A1 | 8/2018 | Hartmann et al. |
| 2018/0259137 | A1 | 9/2018 | Lee et al. |
| 2018/0259570 | A1 | 9/2018 | Henley |
| 2018/0272605 | A1 | 9/2018 | Gmeinsieser et al. |
| 2018/0283642 | A1 | 10/2018 | Liao et al. |
| 2018/0297510 | A1 | 10/2018 | Fiederling et al. |
| 2018/0339643 | A1 | 11/2018 | Kim |
| 2018/0339644 | A1 | 11/2018 | Kim |
| 2018/0354406 | A1 | 12/2018 | Park |
| 2018/0358417 | A1* | 12/2018 | Hamada ................. H10K 50/15 |
| 2019/0198565 | A1 | 6/2019 | Lee et al. |
| 2021/0359214 | A1* | 11/2021 | Kang ................... H10K 85/626 |
| 2023/0119031 | A1 | 4/2023 | Pinos et al. |
| 2023/0217670 | A1* | 7/2023 | Park ...................... H10K 59/12 |
| | | | 257/40 |
| 2023/0223424 | A1 | 7/2023 | Chae et al. |
| 2024/0121975 | A1* | 4/2024 | Choi ............... H10K 59/80518 |
| 2024/0258282 | A1* | 8/2024 | Xu ....................... H10H 20/855 |

FOREIGN PATENT DOCUMENTS

| | | | |
|---|---|---|---|
| DE | 102014112551 | A1 | 3/2016 |
| EP | 1378949 | A1 | 1/2004 |
| EP | 2027608 | A1 | 2/2009 |
| EP | 2203939 | A1 | 7/2010 |
| EP | 2211387 | A2 | 7/2010 |
| EP | 2339658 | A2 | 6/2011 |
| EP | 2491591 | A1 | 8/2012 |
| EP | 2499958 | A1 | 9/2012 |
| EP | 2521161 | A1 | 11/2012 |
| EP | 2521162 | A1 | 11/2012 |
| EP | 2553149 | A1 | 2/2013 |
| EP | 2617069 | A1 | 7/2013 |
| EP | 2674516 | A1 | 12/2013 |
| EP | 2855744 | B1 | 5/2016 |
| EP | 3053199 | A1 | 8/2016 |
| EP | 3144272 | A1 | 3/2017 |
| EP | 200692 | B1 | 12/2018 |
| EP | 3410002 | A1 | 12/2018 |
| EP | 3410003 | A1 | 12/2018 |
| EP | 2710634 | B1 | 10/2020 |
| FR | 2952366 | A1 | 5/2011 |
| FR | 2964796 | A1 | 3/2012 |
| FR | 2969995 | A1 | 7/2012 |
| FR | 2972815 | A1 | 9/2012 |
| FR | 2974940 | A1 | 11/2012 |
| FR | 2974941 | A1 | 11/2012 |
| FR | 2975532 | A1 | 11/2012 |
| FR | 2991342 | A1 | 12/2013 |
| FR | 2991999 | A1 | 12/2013 |
| FR | 2998090 | A1 | 5/2014 |
| FR | 3011383 | A1 | 4/2015 |
| FR | 3041274 | A1 | 3/2017 |
| FR | 3046155 | A1 | 6/2017 |
| FR | 3052915 | A1 | 12/2017 |
| JP | 2016066765 | A | 4/2016 |
| KR | 20140118466 | A | 10/2014 |
| KR | 20170018687 | A | 2/2017 |
| KR | 20180010670 | A | 1/2018 |
| KR | 20180114413 | A | 10/2018 |
| TW | 201417339 | A | 5/2014 |
| TW | 201620163 | A | 6/2016 |
| WO | 2006138465 | A2 | 12/2006 |
| WO | 2011045289 | A1 | 4/2011 |
| WO | 2011048318 | A1 | 4/2011 |
| WO | 2012035243 | A1 | 3/2012 |
| WO | 2012156620 | A2 | 11/2012 |
| WO | 2013182969 | A1 | 12/2013 |
| WO | 2015044620 | A1 | 4/2015 |
| WO | 2016079505 | A1 | 5/2016 |
| WO | 2017068029 | A1 | 4/2017 |
| WO | 2017102708 | A1 | 6/2017 |
| WO | 2017184686 | A1 | 10/2017 |
| WO | 2017216445 | A1 | 12/2017 |
| WO | 2018091657 | A1 | 5/2018 |
| WO | 2018139866 | A1 | 8/2018 |
| WO | 2018143682 | A1 | 8/2018 |
| WO | 2018159977 | A1 | 9/2018 |
| WO | 2018169243 | A1 | 9/2018 |
| WO | 2019092357 | A1 | 5/2019 |
| WO | 2019126539 | A1 | 6/2019 |

* cited by examiner

500

900

14 — BATTERY(S)

12

16 — RADIO(S)

18 — SENSOR(S)

20 — VIDEO GENERATION PROCESSOR(S)

22 — LIGHT SOURCE(S)

24 — MODULATOR(S)

26 — MODULATION PROCESSOR(S)

28 — BEAM COMBINER(S)

30 — PROJECTION OPTIC(S)

32 — SCREEN(S)

34 — LENS(ES)

HIGH EFFICACY POLYCHROMIC LIGHT-EMITTING DIODE (LED)

TECHNICAL FIELD

Embodiments of the disclosure generally relate to light emitting diodes (LEDs), including micro-light emitting diodes (uLEDs) and systems incorporating the LEDs. The LEDs have a polychromic LED structure and include four types of pixels: a red pixel, a green pixel, a blue pixel, and a yellow pixel to facilitate improving power efficiency of the system.

BACKGROUND

Semiconductor light-emitting devices or optical power emitting devices (such as devices that emit ultraviolet (UV) or infrared (IR) optical power), including light emitting diodes, resonant cavity light emitting diodes, vertical cavity laser diodes, and edge emitting lasers, are among the most efficient light sources currently available.

High-intensity/brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a growth substrate such as a sapphire, silicon carbide, III-nitride, or other suitable substrate by metal-organic chemical vapor deposition (MOCVD), molecular beam epitaxy (MBE), or other epitaxial techniques. Sapphire is often used as the growth substrate due to its wide commercial availability and relative ease of use. The stack grown on the growth substrate typically includes one or more n-type layers doped with, for example, Si, formed over the substrate, a light emitting or active region formed over the n-type layer or layers, and one or more p-type layers doped with, for example, Mg, formed over the active region.

Various emerging display applications, including wearable devices, head-mounted, and large-area displays require miniaturized chips composed of arrays of microLEDs (µLEDs or μLEDs) with a high density having a lateral dimension down to less than 100 µm×100 µm. MicroLEDs (uLEDs) typically have dimensions of about 50 µm in diameter or width and smaller that are used to in the manufacture of color displays by aligning in close proximity microLEDs comprising red, blue and green wavelengths.

To make a full-color display via any technology, three different colors (typically red-green-blue, or RGB) are needed to synthesis various colors on a display. Area on a CIE color chart covered by the three chosen colors is referred to as an RGB color gamut. Especially in mobile device applications, energy/power efficiency is of importance, and effective implementation of color synthesis is sought.

There is a need for improving and/or maximizing power efficiency in designs of LEDs, including uLEDs.

SUMMARY

Provided herein are light emitting diodes (LEDs), systems, devices, dies, and arrays with the LEDs. Improved power efficiency of the systems is expected due to including a more luminous fourth pixel which improves a RGB color gamut not having a fourth colored pixel.

An aspect provides a light-emitting diode (LED) die comprising: a plurality of pixels, each of the pixels comprising respective groups of epitaxial stacks included in a microLED comprising one or more tunnel junctions and light emitting layers of different colors, the plurality of pixels comprising: a first set of pixels configured to emit a red light; a second set of pixels configured to emit a green light; a third set of pixels configured to emit a blue light; the red light, the green light, and the blue light defining a RGB (red-green-blue) gamut; and a fourth set of pixels configured to emit a yellow light and to increase power efficiency of the device over that of a device with only RGB pixels.

In another aspect, a light-emitting diode (LED) array comprises any LED die disclosed herein on a device substrate. Another aspect is a light-emitting diode (LED) system comprising any LED array disclosed herein; and a controller configured to control the plurality of pixels individually and/or in sets.

An aspect includes a method of making a display, the method comprising: assembling an LED die according to any embodiments herein with a device substrate such as: a thin film display backplane, a CMOS backplane, or CMOS microIC configured to drive each set of pixels.

A further aspect is a method for operating a display, the method comprising: determining an image to present on the display; driving the plurality of pixels of the LED system of any embodiment herein to provide the image; and controlling individual and/or sets of the plurality of pixels.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements. Unless identified with a scale, the figures herein are not to scale.

DETAILED DESCRIPTION

Figure 1:
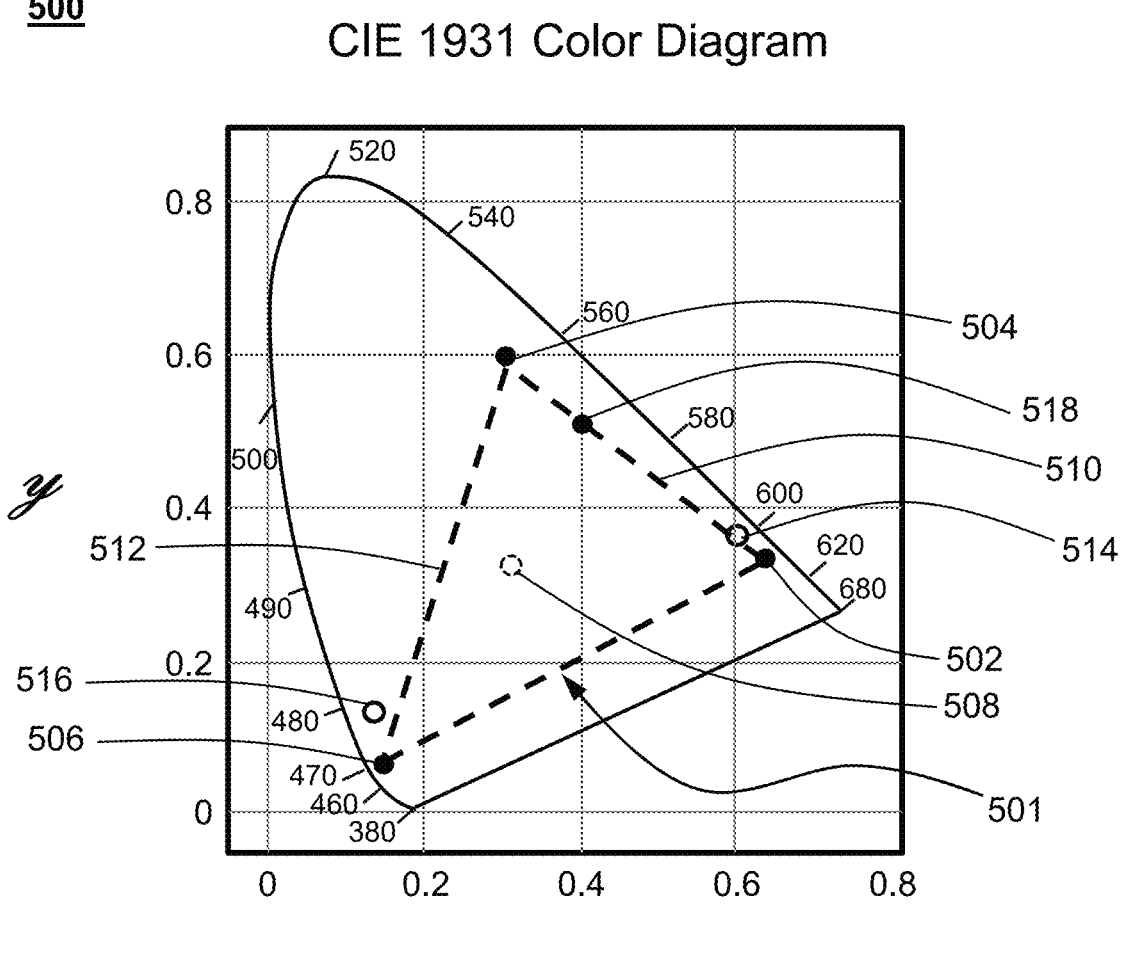
FIG. 1 is an International Commission on Illumination (CIE) 1931 chromaticity diagram "CIE 1931 Color Diagram" for use in illustrating color gamuts and embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

Reference to LED refers to a light emitting diode that emits light when current flows through it. In one or more embodiments, the LEDs herein have one or more characteristic dimensions (e.g., height, width, depth, thickness, etc.) in a range of greater than or equal to 75 micrometers to less than or equal to 300 micrometers. Reference herein to micrometers allows for variation of ±1-5%. In some instances, the LEDs are referred to as micro-LEDs (uLEDs or μLEDs), referring to a light emitting diode having one or more characteristic dimensions (e.g., height, width, depth, thickness, etc.) on the order of micrometers or tens of micrometers. In one or embodiments, one or more dimensions of height, width, depth, thickness have values in a range of 1 to less than 75 micrometers, for example from 1 to 50 micrometers, or from 1 to 25 micrometers. Overall, in one or more embodiments, the LEDs herein may have a characteristic dimension ranging from 1 micrometers to 300 micrometers, and all values and sub-ranges therebetween.

LEDs capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a growth substrate such as a sapphire, silicon carbide, III-nitride, or other suitable substrate by metal-organic chemical vapor deposition (MOCVD), molecular beam epitaxy (MBE), or other epitaxial techniques. Sapphire is often used as a growth substrate due to its wide commercial availability and relative ease of use. The stack grown on the growth substrate typically includes one or more n-type layers doped with, for example, Si, formed over the substrate, a light emitting or active region formed over the n-type layer or layers, and one or more p-type layers doped with, for example, Mg, formed over the active region. An LED die is a structure including a substrate and the stack of semiconductor layers.

Methods of depositing materials, layers, and thin films include but are not limited to: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof.

Methods of forming or growing semiconductor layers including n-type layer, active region, and p-type layer are formed according to methods known in the art. In one or more embodiments, the semiconductor layers are formed by epitaxial (EPI) growth. The semiconductor layers according to one or more embodiments comprise epitaxial layers, III-nitride layers, or epitaxial III-nitride layers. In one or more embodiments, the semiconductor layers comprise a III-nitride material, and in specific embodiments epitaxial III-nitride material. In some embodiments, the III-nitride material comprises one or more of gallium (Ga), aluminum (AI), and indium (In). Thus, in some embodiments, the semiconductor layers comprise one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. The III-nitride materials may be doped with one or more of silicon (Si), oxygen (O), boron (B), phosphorus (P), germanium (Ge), manganese (Mn), or magnesium (Mg) depending upon whether p-type or n-type III-nitride material is needed. In one or more embodiments, the semiconductor layers have a combined thickness in a range of from about 2 μm to about 10 μm, and all values and subranges therebetween.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and alloys), metal alloys, and other conductive materials, metal phosphides (e.g., InP) depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein. A growth or monolithic substrate is a substrate on which semiconductor layers are formed.

A device substrate is a substrate to which a LED chip or die or array is transferred and/or affixed after the semiconductor layers are formed. Exemplary device substrates are: circuit boards, tiles, metalized ceramics, thin film display backplane, CMOS backplane, CMOS microIC, and/or the like. These device substrates range in use from support or sub-mounts for individual LEDs or pixels to fully integrated electronics for displays and lighting applications and other suitable devices or systems.

Examples of different light emitting diode (LED) implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

LED devices may include light emitting diodes, resonant cavity light emitting diodes, vertical cavity laser diodes, edge emitting lasers, or the like (collectively referred to as "LEDs"). Due to their compact size and lower power requirements, LEDs may be attractive candidates for many different applications. They may be used as, for example, light sources (e.g., flashlights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. Multi-junction devices or arrays of LEDs (such as monolithic LED arrays, micro-LED arrays, etc.) may be used for applications where more brightness is desired or required.

For displays, a large RGB color gamut is preferred to allow for enhanced display performance. FIG. 1 is an International Commission on Illumination (CIE) 1931 chromaticity diagram "CIE 1931 Color Diagram" 500 for use in illustrating color gamuts and embodiments described herein. The CIE is an international standards organization that creates standards related to light and color. CIE 1931 color spaces define quantitative links between distributions of wavelength in the visible spectrum and physiologically perceived colors in human color vision. The mathematical relationships that define CIE color spaces are used as tools for color management in connection with illuminated displays. Chromaticity is an objective specification of the quality of a color regardless of its luminance. Chromaticity consists of two independent parameters, often specified as hue and colorfulness (which is also alternatively referred to as saturation, chroma, intensity, or excitation purity). The chromaticity diagram 500 of FIG. 1 is a normalized plot of a standard observer, for which each point corresponds to the color response of the CIE 1931 standard observer and represents the mapping of human color perception in terms of two CIE parameters x and y. The spectral colors are distributed along the edge and include all of the perceived hues, providing a framework for investigating color.

Pixels of an LED display are typically implemented using light emitting diodes (LEDs) of three primary colors: red, green, and blue. As shown in the diagram 500 of FIG. 1, a color gamut is defined by a triangle 501 denoted by a given set of RGB points, e.g., red color coordinates at point 502, green color coordinates at point 504, and blue color coordinates at point 506. For illustration purposes, with reference to (x,y) coordinates of diagram 500, the red color coordinates are (0.64, 0.33) at point 502, the green color coordinates are (0.30, 0.60) at point 504, and the blue color coordinates are (0.15 and 0.06) at point 506. Colors within the triangle 501 may be produced by balancing the fluxes at the primary colors. Within the triangle 501 is a white point 508.

A red-green locus 510 is defined by one side of the triangle 501 between the red point 502 and the green point

504 comprises, and a blue-green locus 512 is defined by another side of the triangle 501 between the blue point 506 and the green point 504.

Typically, for a large RGB color gamut, relatively deeper red (i.e., a longer dominant wavelength) and relatively deeper blue (i.e., a shorter dominant wavelength) are chosen, in addition to a suitable selection of green dominant wavelength. Relatively deeper red and deeper blue are low in luminous efficacy, however, which leads to a low system efficiency. If higher-luminous efficacy red and/or blue is used for an RGB gamut, the gamut accordingly shrinks, which may not be preferred. Synthesizing unsaturated colors using these low-efficacy red and blue are especially inefficient, as red and blue pixels need to be driven harder. LED emitters typically do not have ample flexibility of adjusting color purity (color saturation) of their light emission.

The present disclosure addresses this conflicting issue of providing a larger gamut and also a more efficient display device. By including a fourth pixel that has higher luminous efficacy than the red color, on or near the red-green locus, the system power efficiency is made high while a large gamut is achieved. Accordingly, LED dies, arrays, devices, and systems herein include a fourth pixel that has higher luminous efficacy than the red dominant wavelength points. "Luminous efficacy" refers to a measurement of luminous flux (or light output) to power (lm/W). A luminous efficiency function is one way to convey spectral sensitivity of a viewer's visual perception of light. A color or emission having a luminous efficacy higher than the gamut-defining red means that the color emitted is more readily perceived by a viewer than a color of a lower luminous efficacy. Herein, a yellow light/color, e.g., resulting from a wavelength on or near the red-green locus 510 is chosen, in addition to suitable selections of wavelength for red, blue, and green light. Reference to yellow light includes colors ranging from greenish-yellow to reddish-yellow.

In one or more embodiments, the fourth pixel is configured to emit a shorter wavelength compared to the gamut-defining red. As a non-limiting example, therefore, as shown in FIG. 1, if a wavelength of red at red point 502 in a typical display is 615 nm, a choice of the fourth pixel wavelength may be 570 nm at yellow point 518.

Point 518 having exemplary coordinates (0.40, 0.55) is an exemplary yellow wavelength.

As for gamut-defining RGB points, in one or more embodiments, a red color coordinate is in a range of $0.64 \leq x \leq 0.67$ and y=0.33; a green color coordinate is in a range of $0.21 \leq x \leq 0.30$ and $0.60 \leq y \leq 0.71$; and a blue color coordinate is in a range of $0.14 \leq x \leq 0.15$ and $0.06 \leq y \leq 0.08$. In one or more embodiments, a gamut-defining RGB comprises a red dominant wavelength in a range of 610 to 630 nm; a green dominant wavelength in a range of 530 to 555 nm; and a blue dominant wavelength in a range of 465 to 470 nm.

Aspects of the present disclosure may be applied to direct color-emitter displays, e.g., LED displays including uLEDs that include stacked multi-color emitters.

In uLED display devices, integration of a fourth pixel becomes a technology that enhances color synthesis but challenges with respect to handling are to be considered. Mass-transfer techniques of uLED chips are being developed yet a commercial concern is the die attach speed to deal with millions of RGB chips per display device. Addition of fourth chips for the fourth pixel could complicate the process greatly. One possible solution is utilizing stacked polychromic LED chips, which include tunnel junctions, with an addition of a fourth pixel epitaxial stack layer, which is expected to add a nominal amount of epi time, and the die fab is completed via conventional techniques. In this way, a uLED chip contains the fourth pixel and would not add any extra time in mass-transfer die attach, or when the epi wafer is monolithically integrated with the backplane, there's no increase of process time per display device fundamentally. Thus, the present disclosure is believed to be especially advantageous for uLED display applications.

As used herein, the term "tunnel junction" refers to a structure that allows electrons to tunnel from the valence band of a p-type layer to the conduction band of an n-type layer in reverse bias. When an electron tunnels, a hole is left behind in the p-type layer, such that carriers are generated in both layers. Accordingly, in an electronic device like a diode, where only a small leakage current flows in reverse bias, a large current can be carried in reverse bias across a tunnel junction. A tunnel junction requires a particular alignment of the conduction and valence bands at the p/n tunnel junction, which has typically been achieved in other materials systems using very high doping (e.g., p++/n++ junction in the (Al)GaAs material system). III-nitride materials have an inherent polarization that creates an electric field at heterointerfaces between different alloy compositions. This polarization field can be utilized to achieve the required band alignment for tunneling.

LED Wafers and Arrays

Figure 2:
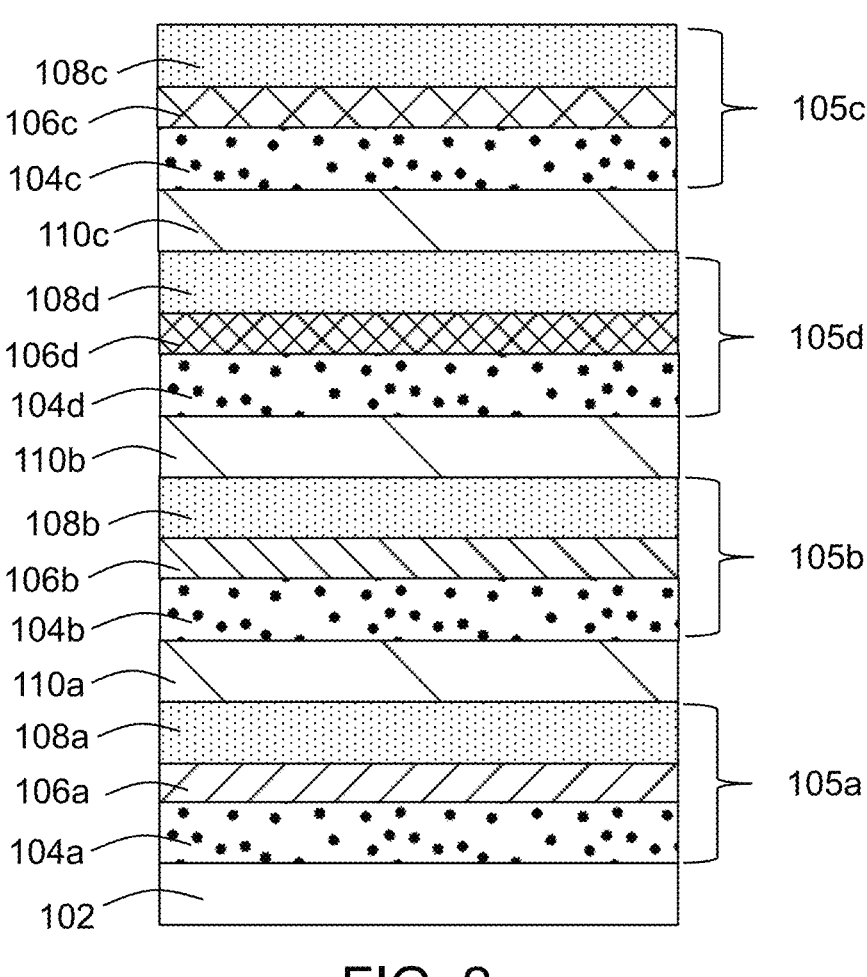
FIG. 2 is a schematic view illustrating in cross-section vertically-stacked epitaxial layers of an LED wafer according to an embodiment suitable for light emitting diodes (LEDs)

FIG. 2 is a schematic view illustrating in cross-section vertically-stacked epitaxial layers (or epi layers) of an LED wafer or die according to various embodiments suitable for light emitting diodes (LEDs) having four types of pixels. The LED wafer or die 100 of FIG. 2 is polychromic, and the wafer or die comprises one or more tunnel junctions, such that a first group of pixels is configured to emit a red light, e.g., a first red dominant wavelength, a second group of pixels is configured to emit a green light, e.g., a first green dominant wavelength, a third group of pixels is configured to emit a blue light, e.g., a first blue dominant wavelength, and a fourth group of pixels is configured to emit a yellow light, e.g., a wavelength on or near a red-green locus. In one or more embodiments, the yellow light comprises colors ranging from greenish-yellow to reddish-yellow.

The LED wafer or die 100 of FIG. 2 comprises four light emitting stacks or p-n junctions: a first light emitting stack 105a, a second light emitting stack 105b, a third light emitting stack 105c, and a fourth light emitting stack 105d. In one or more embodiments, the first light emitting stack 105a contains a first light-emitting active region 106a that is configured to emit a first red dominant wavelength (e.g., a red light) when current is applied, a second light emitting stack 105b contains a second light-emitting active region 106b that is configured to emit a first green dominant wavelength (e.g., a green light) when current is applied, and a third light emitting stack 105c contains a third light-emitting active region 106c that is configured to emit a first blue dominant wavelength (e.g., a blue light) when current is applied. Accordingly, the first light emitting stack 105a, second light emitting stack 105b, third light emitting stack 105c together define a RGB gamut upon application of current, and the fourth light emitting stack 105d provides a light emission to improve efficacy of a display. In one or more embodiments, the fourth light emitting stack 105d is for providing a fourth set of pixels configured to emit a yellow color, e.g., a wavelength on or near a red-green locus comprising a luminous efficacy that is higher than a first pixel (red dominant wavelength), which is provided by the first light emitting stack 105a.

Turning to FIG. 2, on a substrate 102, e.g. a growth substrate, of the LED wafer 100 is the first light emitting stack 105a, which comprises: a first n-type layer 104a, a first light-emitting active region 106a grown on the first n-type layer 104a, and a first p-type layer 108a formed on the first light-emitting active region 106a. A first tunnel junction 110a located on the first p-type layer 108a and below a second n-type layer 104b separates the first light emitting stack 105a from the second light emitting stack 105b.

The second light emitting stack 105b comprises: the second n-type layer 104b, a second light-emitting active region 106b grown on the second n-type layer 104b, and a second p-type layer 108b formed on the second light-emitting active region 106b. A second tunnel junction 110b located on the second p-type layer 108b and below a fourth p-type layer 104d separates the second light emitting stack 105b from the fourth light emitting stack 105d.

In the embodiment of the LED wafer 100, the fourth light emitting stack 105d is directly above the second light emitting stack 105b. The fourth light emitting stack 105d comprises: the fourth n-type layer 104d, a fourth light-emitting active region 106d grown on the fourth n-type layer 104d, and a fourth p-type layer 108d formed on the fourth light-emitting active region 106d. A third tunnel junction 110c located on the fourth p-type layer 108d and below a third n-type layer 104c separates the fourth light emitting stack 105d from the third light emitting stack 105c.

The third light emitting stack 105c is above all the first, second, and fourth light emitting stacks 105a, 105b, and 105d, while being positioned directly above the fourth light emitting stack 105d. The third light emitting stack 105c comprises: the third n-type layer 104c, a third light-emitting active region 106c grown on the third n-type layer 104c, a third p-type layer 108c formed on the third light-emitting active region 106c. In this embodiment, the fourth light emitting stack 105d is configured to emit a yellow color.

Figure 3:
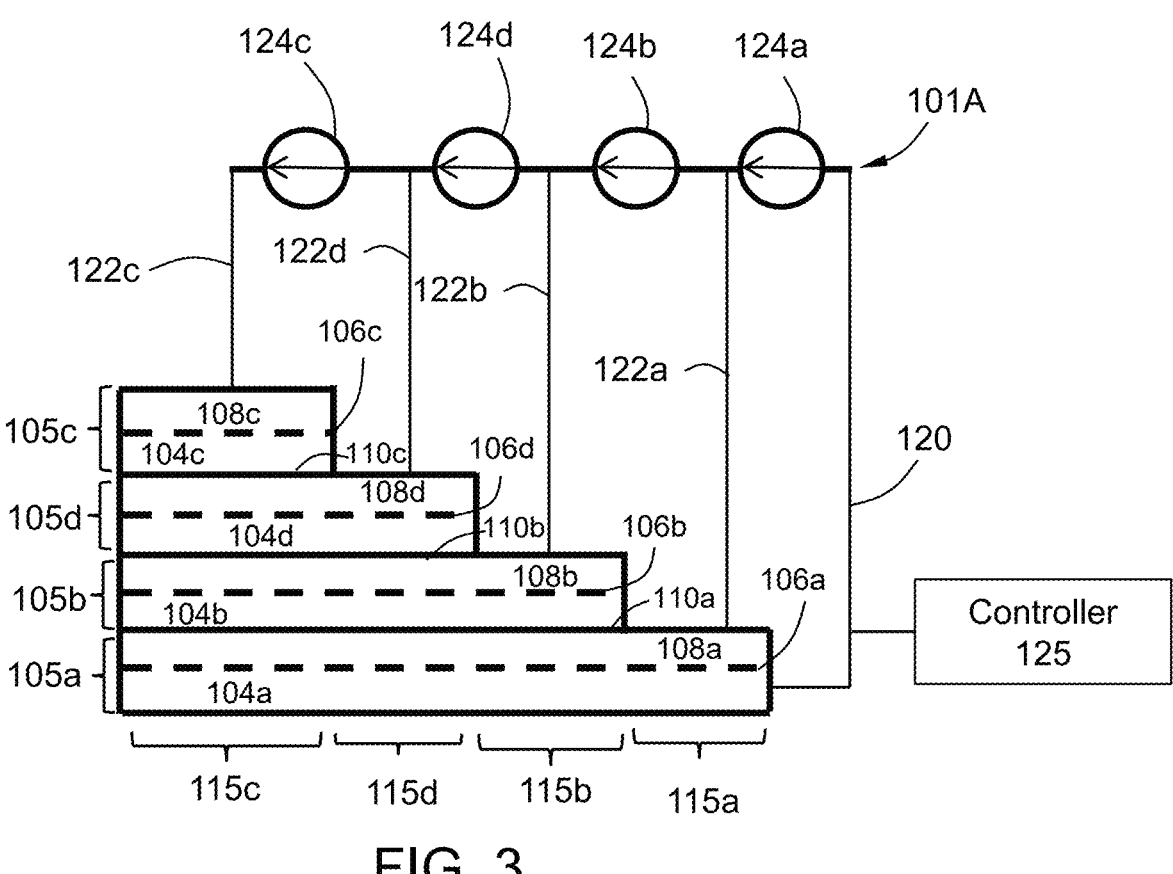
FIG. 3 is a schematic view illustrating in cross-section an LED having a mesa structure with electrical schemes according to an embodiment.

FIG. 3 is a schematic view illustrating in cross-section an exemplary LED array with electrical scheme, which may utilize, for example, the epitaxial stack of FIG. 2. The array can have a mesa structure or a via structure. In the via structure, all the vertical areas are kept active. In the mesa structure, vertically-overlapping areas are deactivated, or the p-electrode areas are limited to where light emission is required. For illustration purposes, the LED wafer of FIG. 2 is shown in conjunction with a device circuit in FIG. 3.

In FIG. 3 providing a mesa structure, a LED wafer or die according to FIG. 2 is prepared as-appropriate to create mesas from the stacks and optical isolation as-needed, along with electrical contacts and connections, which forms the basis of an LED array. The first light emitting stack 105a has been prepared to connect the first n-type layer 104a by connection line 120 to a device circuit 101A including multiple pixel current sources/drivers: 124a, 124b, 124d, 124c. The first p-type layer 108a is exposed and prepared with a contact (not separately shown) and included in the circuit 101A by a contact connection line 122a. A first pixel circuit includes a first pixel driver 124a in conjunction with the first light emitting stack 105a, a portion of which including its exposed p-layer 108a defines a first pixel 115a. The second p-type layer 108b is exposed and prepared with a contact (not separately shown) and included the circuit 101A by a contact connection line 122b. A second pixel circuit includes a second pixel driver 124b in conjunction with the second light emitting stack 105b, a portion of which including its exposed p-layer 108b, which as layered on the first light emitting stack 105a defines a second pixel 115b. The fourth p-type layer 108d is exposed and prepared with a contact (not separately shown) and included the circuit 101A by a contact connection line 122d. A fourth pixel circuit includes a fourth pixel driver 124d in conjunction with the fourth light emitting stack 105d, a portion of which including its exposed p-layer 108d, which as layered on the first light emitting stack 105a and the second light emitting stack 105b defines a fourth pixel 115d. The third p-type layer 108c is exposed and prepared with a contact (not separately shown) and included the circuit 101A by a contact connection line 122c. A third pixel circuit includes a third pixel driver 124c in conjunction the third light emitting stack 105c, a portion of which including its exposed p-layer 108c, which as layered on the first light emitting stack 105a, the second light emitting stack 105b, and the fourth light emitting stack 105d, defines a third pixel 115c. A controller 125 is included in the circuit 101A. The controller is configured to control a plurality of pixels individually and/or in sets.

Figure 4:
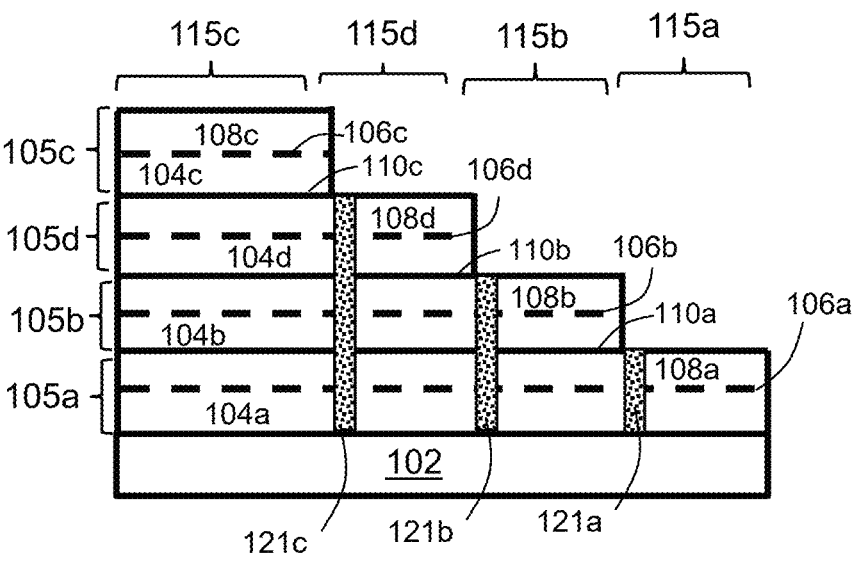
FIG. 4 is a schematic view illustrating in cross-section an LED array on a substrate according to an embodiment.

FIG. 4 illustrates an LED array including a mesa-structured LED wafer or die according to FIG. 3 on a substrate. For simplicity, the electrical schemes are not included in FIG. 4 but are understood to be analogously applicable, and structures of like reference numerals of FIG. 3 are applicable to FIG. 4. Further in FIG. 4, the LED wafer or die is located on a substrate 102. In this embodiment, the first pixel 115a and the second pixel 115b are separated by a first trench 121a extending to the substrate 102. In this embodiment, the second pixel 115b and the fourth pixel 115d are separated by a second trench 121b extending to the substrate 102. In this embodiment, the fourth pixel 115d and the third pixel 115c are separated by a third trench 121c extending to the substrate 102. In this embodiment, the substrate 102 corresponds to the growth substrate used when preparing the epitaxial layers.

Figure 5:
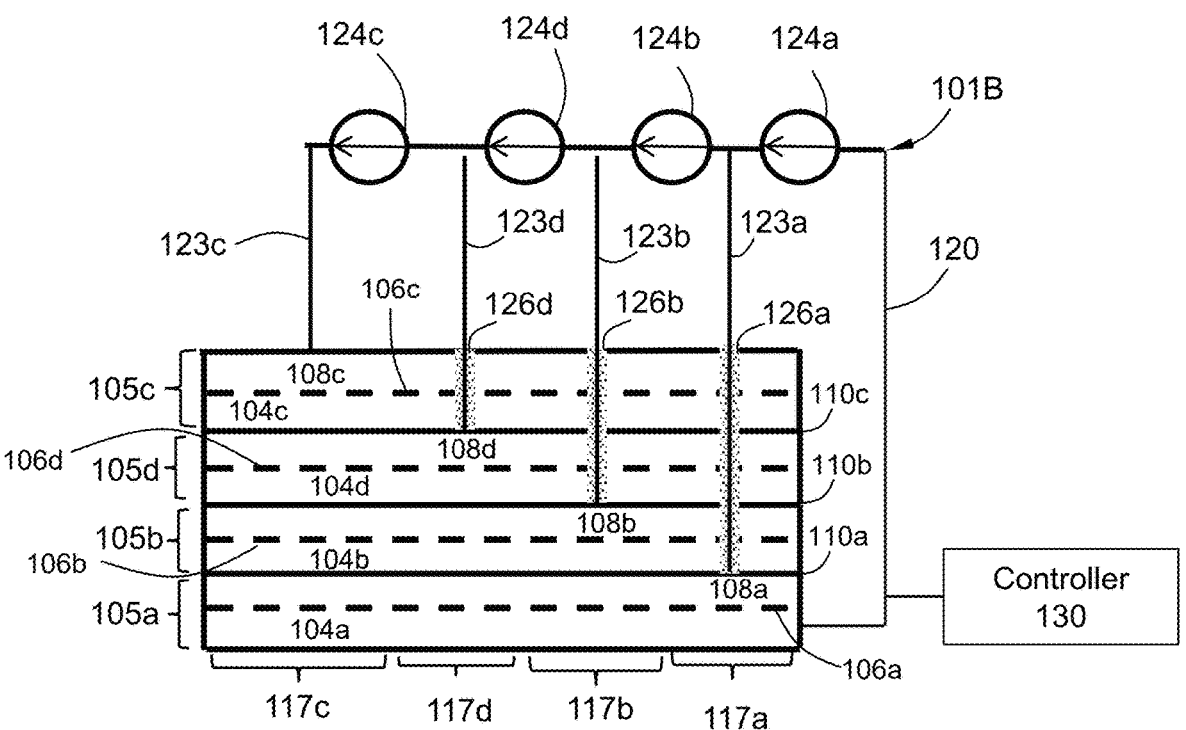
FIG. 5 is a schematic view illustrating in cross-section an LED having a via structure with electrical schemes according to an embodiment.

In FIG. 5 providing a via structure, the LED wafer or die according to FIG. 2 is prepared with electrical contacts and connections, which forms the basis of an LED array. The first light emitting stack 105a has been prepared to connect the first n-type layer 104a by connection line 120 to a device circuit 101B including multiple pixel current sources/drivers: 124a, 124b, 124d, 124c. The LED wafer of FIG. 2 is further prepared to create multiple contact openings/vias 126a, 126b, 126d and corresponding electrode connection lines 123a, 123b, 123d to create contact with respective p-type layers. A first pixel 117a is defined by portions of each of the first light emitting stack 105a, the second light emitting stack 105b, the fourth light emitting stack 105d, and the third light emitting stack 105c which include a first via 126a for accommodating the first electrode connection line 123a. A second pixel 117b is defined by portions of each of the first light emitting stack 105a, the second light emitting stack 105b, the fourth light emitting stack 105d, and the third light emitting stack 105c which include the second via 126b for accommodating the second electrode connection line 123d. A fourth pixel 117d is defined by portions of each of the first light emitting stack 105a, the second light emitting stack 105b, the fourth light emitting stack 105d, and the third light emitting stack 105c which include the fourth via 126d for accommodating the fourth electrode connection line 123d. A third pixel 117c is defined by portions of each of the first light emitting stack 105a, the second light emitting stack 105b, the fourth light emitting stack 105d, and the third light emitting stack 105c in the absence of a via.

A third electrode connection line 123c is in contact with p-type layer 108c, without the presence of a contact opening/via. The first p-type layer 108a is included in the circuit 101B by a first contact opening/electrode connection line 123a. A first pixel driver 124a is used in conjunction with the first light emitting stack 105a. The second p-type layer 108b is included in the circuit 101B by a second contact opening/electrode connection line 123b. A second pixel driver 124b is used in conjunction with the second light emitting stack 105b. The fourth p-type layer 108d is included the circuit 101B by a fourth contact opening/electrode line 123d. A fourth pixel driver 124d is used in conjunction with the fourth light emitting stack 105d. The third p-type layer 108c is included in the circuit 101B by a second contact opening/electrode connection line 123c. A third pixel driver 124c is used in conjunction with the third light emitting stack 105c. A controller 130 is included in the circuit 101B. The controller is configured to control a plurality of pixels individually and/or in sets.

Figure 6:
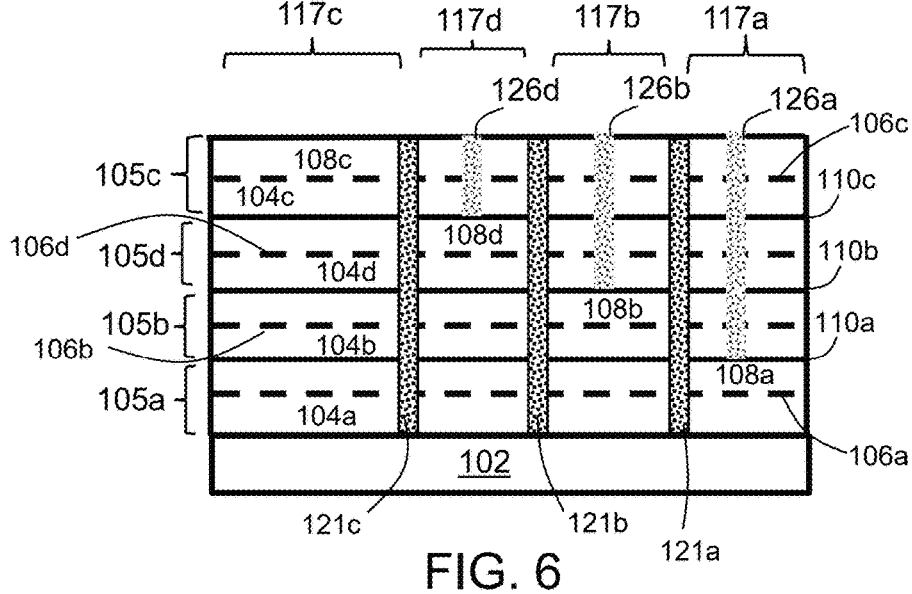
FIG. 6 is a schematic view illustrating in cross-section an LED array on a substrate according to an embodiment.

FIG. 6 illustrates an LED array including a via-structured LED wafer or die according to FIG. 5 on a substrate. For simplicity, the electrical schemes are not included in FIG. 6 but are understood to be analogously applicable, and structures of like reference numerals of FIG. 5 are applicable to FIG. 6. Further in FIG. 6, the LED wafer or die is located on a substrate 102. In this embodiment, the first pixel 117a and the second pixel 117b are separated by a first trench 121a extending to the substrate 102. In this embodiment, the second pixel 117b and the fourth pixel 117d are separated by a second trench 121b extending to the substrate 102. In this embodiment, the fourth pixel 117d and the third pixel 117c are separated by a third trench 121c extending to the substrate 102. In this embodiment, the substrate 102 corresponds to the growth substrate used when preparing the epitaxial layers.

Herein embodiments include: a vertically-stacked epi wafer of RGB+X (where X is a yellow or another color wavelength along or near the red-green locus).

In one or more embodiments, wafer processing is applied to vertically-stacked epi wafer or dies so that polychromic uLED chips are generated. In one or more embodiments, any polychromic uLED chips herein are mass-transferred to a device substrate to complete a display unit.

In one or more embodiments, wafer processing is applied to vertically-stacked epi wafer or dies so that polychromic uLED arrays are generated. In one or more embodiments, any polychromic uLED arrays herein are subsequently attached to a back plane to complete a display unit.

Figure 7:
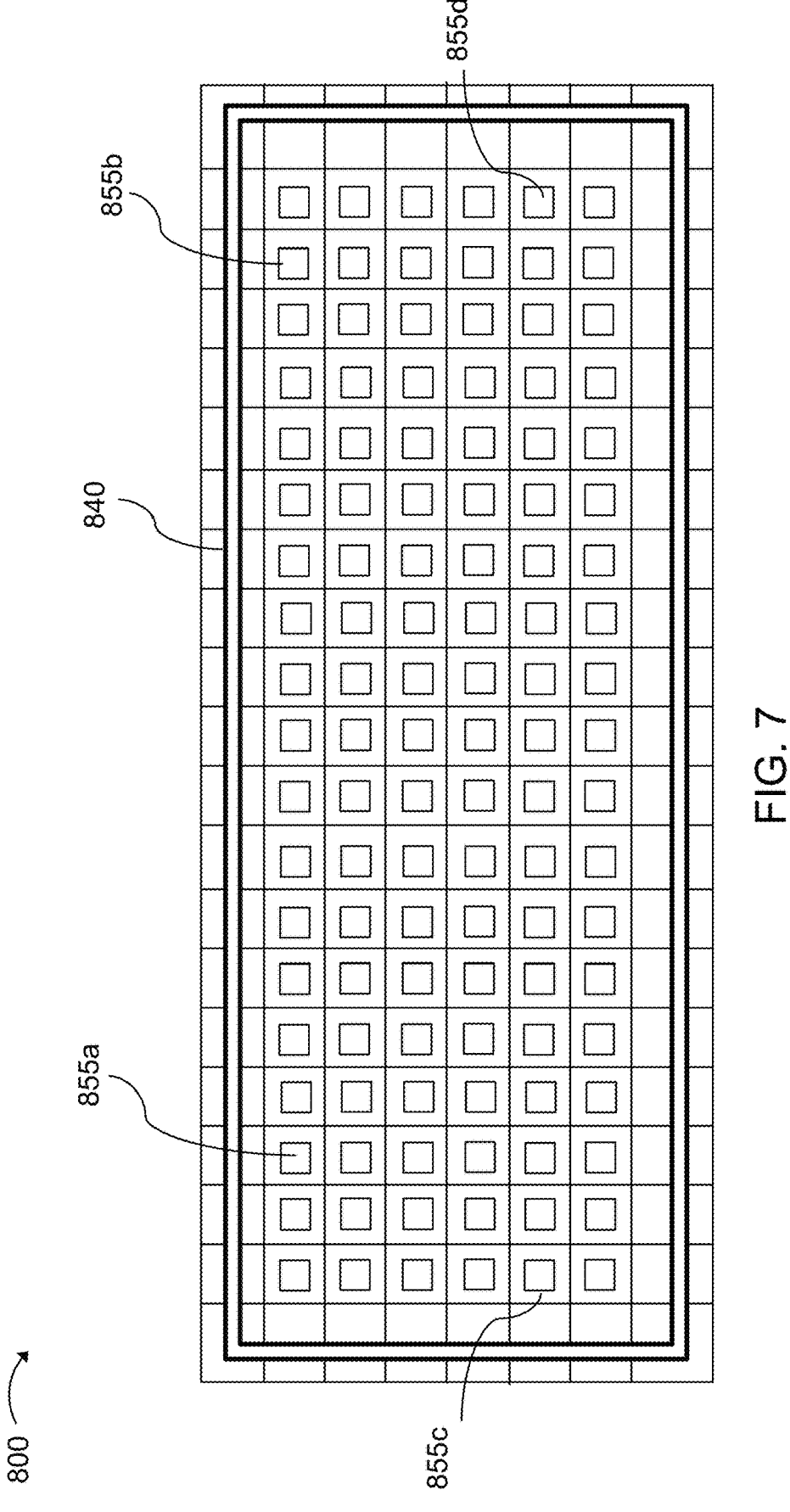
FIG. 7 illustrates a top plan view of a uLED display device according to one or more embodiments.

FIG. 7 shows a top plan view of an exemplary uLED monolithic array 800 comprising a plurality of pixels arranged in a grid of 6×19. Pixels 855a, 855b, 855c, and 855d are respectively four sets of different pixels, configured to emit different wavelengths, colors. In this embodiment, a common cathode 840 is connected to the pixels. Anodes, not shown, present on the underside are included with each pixel. In one or more embodiments, the array comprises an arrangement of 2×2 mesas, 4×4 mesas, 20×20 mesas, 50×50 mesas, 100×100 mesas, or n1×n2 mesas, where each of n1 and n2 is a number in a range of from 2 to 1000, and n1 and n2 can be equal or not equal.

In one or more embodiments, arrays of micro-LEDs (µLEDs or uLEDs) are used. Micro-LEDs can support high density pixels having a lateral dimension less than 100 µm by 100 µm. In some embodiments, micro-LEDs with dimensions of about 50 µm in diameter or width and smaller can be used. Such micro-LEDs can be used for the manufacture of color displays by aligning in close proximity micro-LEDs comprising red, blue and green wavelengths.

In some embodiments, the light emitting arrays include small numbers of micro-LEDs positioned on substrates that are centimeter scale area or greater. In some embodiments, the light emitting arrays include micro-LED pixel arrays with hundreds, thousands, or millions of light emitting LEDs positioned together on centimeter scale area substrates or smaller. In some embodiments, micro-LEDs can include light emitting diodes sized between 30 microns and 500 microns. The light emitting array(s) can be monochromatic, RGB, or other desired chromaticity. In some embodiments, pixels can be square, rectangular, hexagonal, or have curved perimeter. Pixels can be of the same size, of differing sizes, or similarly sized and grouped to present larger effective pixel size.

In some embodiments, light emitting pixels and circuitry supporting light emitting arrays are packaged and optionally include a submount or printed circuit board connected for powering and controlling light production by semiconductor LEDs. In certain embodiments, a printed circuit board supporting light emitting array includes electrical vias, heat sinks, ground planes, electrical traces, and flip chip or other mounting systems. The submount or printed circuit board may be formed of any suitable material, such as ceramic, silicon, aluminum, etc. If the submount material is conductive, an insulating layer is formed over the substrate material, and the metal electrode pattern is formed over the insulating layer. The submount can act as a mechanical support, providing an electrical interface between electrodes on the light emitting array and a power supply, and also provide heat sink functionality.

In some embodiments, LED light emitting arrays include optical elements such as lenses, metalenses, and/or pre-collimators. Optical elements can also or alternatively include apertures, filters, a Fresnel lens, a convex lens, a concave lens, or any other suitable optical element that affects the projected light from the light emitting array. Additionally, one or more of the optical elements can have one or more coatings, including UV blocking or anti-reflective coatings. In some embodiments, optics can be used to correct or minimize two- or three dimensional optical errors including pincushion distortion, barrel distortion, longitudinal chromatic aberration, spherical aberration, chromatic aberration, field curvature, astigmatism, or any other type of optical error. In some embodiments, optical elements can be used to magnify and/or correct images. Advantageously, in some embodiments magnification of display images allows the light emitting array to be physically smaller, of less weight, and require less power than larger displays. Additionally, magnification can increase a field of view of the displayed content allowing display presentation equals a user's normal field of view.

Herein, one or more embodiments provide light-emitting diode (LED) die comprising: a plurality of pixels, each of the pixels comprising respective groups of epitaxial stacks included in a microLED comprising one or more tunnel junctions and light emitting layers of different colors, the plurality of pixels comprising: a first set of pixels configured to emit a red light; a second set of pixels configured to emit a green light; a third set of pixels configured to emit a blue light; the red light, the green light, and the blue light defining a RGB (red-green-blue) gamut; and a fourth set of pixels configured to emit a yellow light and to increase power efficiency of the device over that of a device with only RGB pixels. The yellow light can comprise colors ranging from greenish-yellow to reddish-yellow. In one or more embodiments, the fourth set of pixels are configured to emit an emission comprising a luminous efficacy that is higher than the first set of pixels.

In some embodiments, the microLED comprises: a first epitaxial stack comprising: a first active region on a first n-type layer, and a first p-type layer on the first active region; a second epitaxial stack comprising: a second active region on a second n-type layer, and a second p-type layer on the second active region; a third epitaxial stack comprising: a third active region on a third n-type layer, and a third p-type layer on the third active region; a fourth epitaxial stack comprising: a fourth active region on a fourth n-type layer, and a fourth p-type layer on the fourth active region; and a first tunnel junction adjacent to the first epitaxial stack, a second tunnel junction adjacent to the second epitaxial stack, and a third tunnel junction adjacent to the third epitaxial stack, wherein the first, second, third, and fourth epitaxial stacks are in a stacked relationship within at least one set of pixels.

In some embodiments, the third epitaxial stack is above the second epitaxial stack; the second epitaxial stack is above the first epitaxial stack; the fourth epitaxial stack is above the first epitaxial stack and below the second epitaxial stack, the first and fourth epitaxial stacks being separated by the first tunnel junction, and the second and fourth epitaxial stacks being separated by the second tunnel junction; the third tunnel junction separates the second epitaxial stack and the third epitaxial stack; and the fourth epitaxial stack is configured to emit the yellow light comprising colors ranging from greenish-yellow to reddish-yellow.

In some embodiments, the LED die comprises a mesa structure, wherein a portion of the first p-type layer is exposed, a portion of the second p-type layer is exposed, and a portion of the fourth p-type layer is exposed, and respective p-electrodes are limited to where light emission is required.

In some embodiments, the LED die comprises a via structure, wherein the microLED further comprises: a first via for accommodating a first electrode connection from the first p-type layer, a second via for accommodating a second electrode connection from second p-type layer, a fourth via for accommodating a fourth electrode connection from the fourth p-type layer, wherein there is not a via associated with the third p-type layer.

LED Arrays-Displays and Systems

In terms of implementation, LED arrays and displays and systems herein comprise sets of four types of pixels.

Light-emitting diode (LED) arrays and/or displays comprises any LED die disclosed herein on a substrate. In an embodiment, a fourth set of pixels is configured to emit a yellow light. In one or more embodiments, the fourth set of pixels is configured to emit a dominant wavelength of 570±5 nm; and optionally: the first red dominant wavelength is in a range of 610 to 630 nm; the first green dominant wavelength is in a range of 530 to 555 nm; and the first blue dominant wavelength is in a range of 465 to 470 nm.

Light-emitting diode (LED) systems comprise: any the LED array or display herein; and a controller configured to control the plurality of pixels individually and/or in sets.

Methods of making a display comprise: assembling an LED die according to one of embodiments (a) to (g) with a thin film display backplane, a CMOS backplane, or CMOS microIC configured to drive each set of pixels.

Applications

According to some embodiments, a method for operating a display comprises: determining an image to present on the display; driving a plurality of pixels any LED die or array or display or system disclosed herein to provide the image, and controlling individual and/or sets of the plurality of pixels. In a detailed embodiment, the fourth set of pixels is configured to emit a yellow light.

Figure 8:
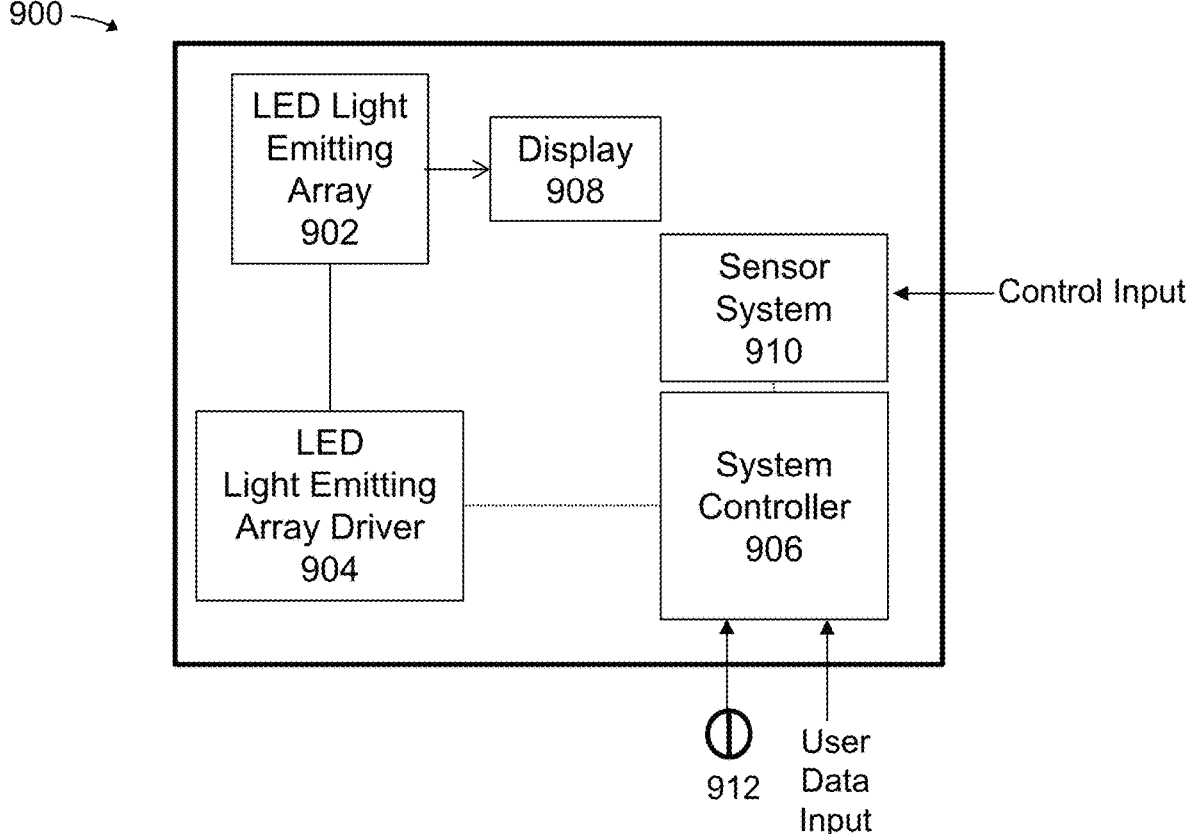
FIG. 8 schematically illustrates an exemplary display system comprising uLED devices according to embodiments herein.

FIG. 8 schematically illustrates an exemplary display system 900 utilizing LEDs, including uLEDs, disclosed herein. The display system 900 comprises an LED light emitting array 902 and display 908 in electrical communication with an LED driver 904. The display system 900 also comprises a system controller 906, such as a microprocessor. The controller 906 is coupled to the LED driver 904. The controller 906 may also be coupled to the display 908 and to optional sensor(s) 910, and be powered by power source 912. In one or more embodiments, user data input is provided to system controller 906.

In one or more embodiments, the system is a camera flash system utilizing uLEDs. In such an embodiment, the LED light emitting array 902 is an illumination array and lens system and the display 908 comprises a camera, wherein the LEDs of 902 and the camera of 908 may be controlled by the controller 906 to match their fields of view.

Optionally sensors 910 with control input may include, for example, positional sensors (e.g., a gyroscope and/or accelerometer) and/or other sensors that may be used to determine the position, speed, and orientation of system. The signals from the sensors 910 may be supplied to the controller 906 to be used to determine the appropriate course of action of the controller 906 (e.g., which LEDs are currently illuminating a target and which LEDs will be illuminating the target a predetermined amount of time later).

In operation, illumination from some or all of the pixels of the LED array in 902 may be adjusted—deactivated, operated at full intensity, or operated at an intermediate intensity. As noted above, beam focus or steering of light emitted by the LED array in 902 can be performed electronically by activating one or more subsets of the pixels, to permit dynamic adjustment of the beam shape without moving optics or changing the focus of the lens in the lighting apparatus.

LED array systems such as described herein may support various other beam steering or other applications that benefit from fine-grained intensity, spatial, and temporal control of light distribution. These applications may include, but are not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. Associated optics may be distinct at a pixel, pixel block, or device level. An example light emitting pixel array may include a device having a commonly controlled central block of high intensity pixels with an associated common optic, whereas edge pixels may have individual optics. In addition to flashlights, common applications supported by light emitting pixel arrays include video lighting, automotive headlights, architectural and area illumination, and street lighting.

Other applications of LED devices herein include augmented reality/virtual reality (AR/VR) systems, which may utilize uLEDs disclosed herein. One or more AR/VR systems include: augmented (AR) or virtual reality (VR) headsets, glasses, or projectors. Such AR/VR systems includes an LED light emitting array, an LED driver (or light emitting array controller), a system controller, an AR or VR display, a sensor system 810. Control input may be provided to the sensor system, while power and user data input is provided to the system controller. As will be understood, in some embodiments modules included in the AR/VR system can be compactly arranged in a single structure, or one or more elements can be separately mounted and connected via wireless or wired communication. For example, the light emitting array, AR or VR display, and sensor system can be mounted on a headset or glasses, with the LED driver and/or system controller separately mounted.

In one embodiment, the light emitting array can be used to project light in graphical or object patterns that can support AR/VR systems. In some embodiments, separate light emitting arrays can be used to provide display images, with AR features being provided by a distinct and separate micro-LED array. In some embodiments, a selected group of pixels can be used for displaying content to the user while tracking pixels can be used for providing tracking light used in eye tracking. Content display pixels are designed to emit visible light, with at least some portion of the visible band (approximately 400 nm to 750 nm). In contrast, tracking pixels can emit light in visible band or in the IR band (approximately 750 nm to 2,200 nm), or some combination thereof. As an alternative example, the tracking pixels could operate in the 800 to 1000 nanometer range. In some embodiments, the tracking pixels can emit tracking light during a time period that content pixels are turned off and are not displaying content to the user.

The AR/VR system can incorporate a wide range of optics in the LED light emitting array and/or AR/VR display, for example to couple light emitted by the LED light emitting array into AR/VR display as discussed above. For AR/VR applications, these optics may comprise nanofins and be designed to polarize the light they transmit.

In one embodiment, the light emitting array controller can be used to provide power and real time control for the light emitting array. For example, the light emitting array controller can be able to implement pixel or group pixel level control of amplitude and duty cycle. In some embodiments, the light emitting array controller further includes a frame buffer for holding generated or processed images that can be supplied to the light emitting array. Other supported modules can include digital control interfaces such as Inter-Integrated Circuit (I2C) serial bus, Serial Peripheral Interface (SPI), USB-C, HDMI, Display Port, or other suitable image or control modules that are configured to transmit needed image data, control data or instructions.

In operation, pixels in the images can be used to define response of corresponding light emitting array, with intensity and spatial modulation of LED pixels being based on the image(s). To reduce data rate issues, groups of pixels (e.g. 5×5 blocks) can be controlled as single blocks in some embodiments. In some embodiments, high speed and high data rate operation is supported, with pixel values from successive images able to be loaded as successive frames in an image sequence at a rate between 30 Hz and 100 Hz, with 60 Hz being typical. Pulse width modulation can be used to control each pixel to emit light in a pattern and with an intensity at least partially dependent on the image.

In some embodiments, the sensor system can include external sensors such as cameras, depth sensors, or audio sensors that monitor the environment, and internal sensors such as accelerometers or two or three axis gyroscopes that monitor AR/VR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position. As another example, based on the one or more measurement signals from one or more gyroscope or position sensors that measure translation or rotational movement, an estimated position of AR/VR system relative to an initial position can be determined.

In some embodiments, the system controller uses data from the sensor system to integrate measurement signals received from the accelerometers over time to estimate a velocity vector and integrate the velocity vector over time to determine an estimated position of a reference point for the AR/VR system. In other embodiments, the reference point used to describe the position of the AR/VR system can be based on depth sensor, camera positioning views, or optical field flow.

Based on changes in position, orientation, or movement of the AR/VR system, the system controller can send images or instructions the light emitting array controller. Changes or modification in the images or instructions can also be made by user data input, or automated data input as needed. User data input can include but is not limited to that provided by audio instructions, haptic feedback, eye or pupil positioning, or connected keyboard, mouse, or game controller.

Figure 9:
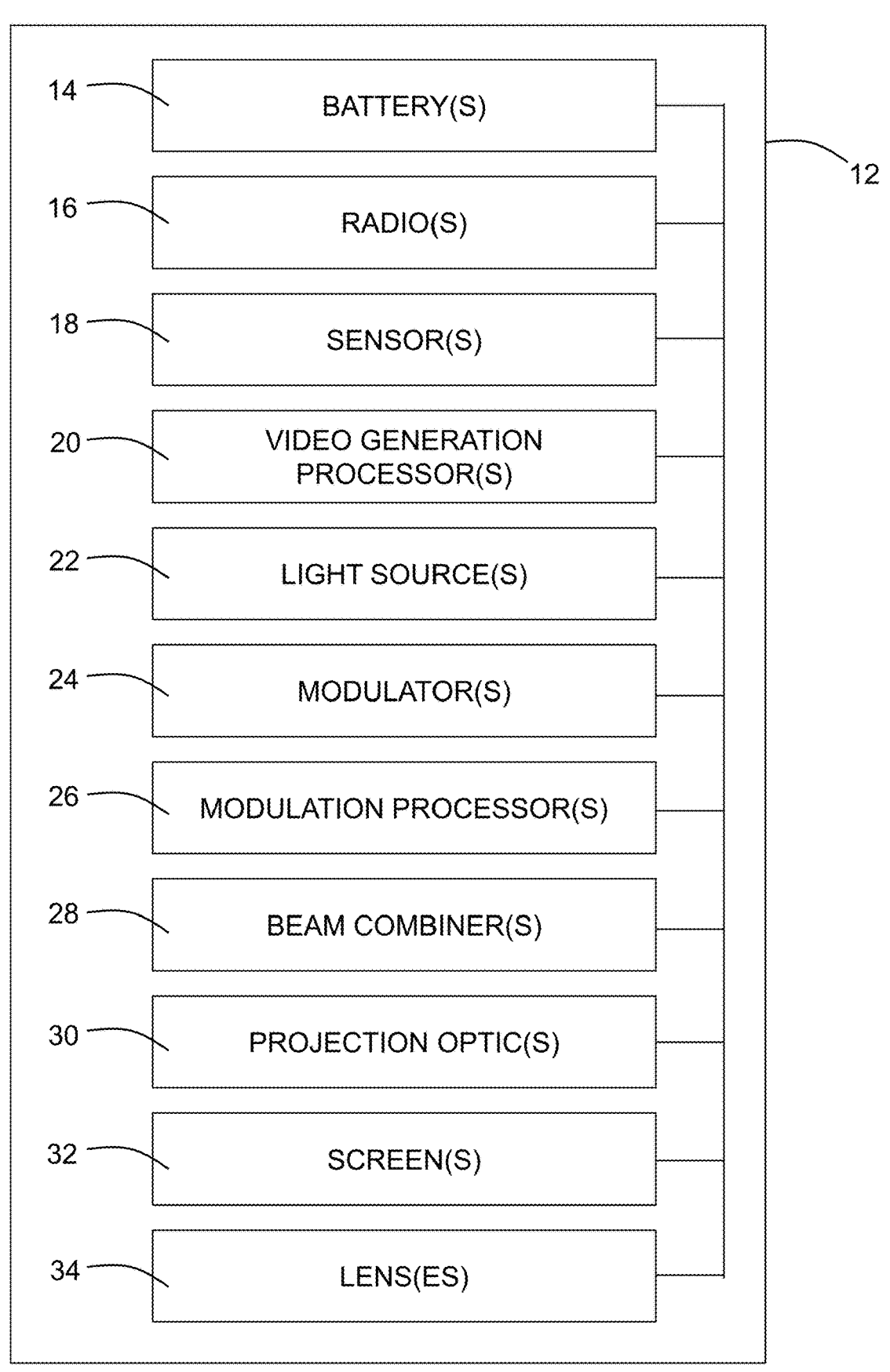
FIG. 9 shows a block diagram of a visualization system according to one or more embodiments.

FIG. 9 shows a block diagram of an example of a visualization system 10. The visualization system 10 can include a wearable housing 12, such as a headset or goggles. The housing 12 can mechanically support and house the elements detailed below. In some examples, one or more of the elements detailed below can be included in one or more additional housings that can be separate from the wearable housing 12 and couplable to the wearable housing 12 wirelessly and/or via a wired connection. For example, a separate housing can reduce the weight of wearable goggles, such as by including batteries, radios, and other elements. The housing 12 can include one or more batteries 14, which can electrically power any or all of the elements detailed below. The housing 12 can include circuitry that can electrically couple to an external power supply, such as a wall outlet, to recharge the batteries 14. The housing 12 can include one or more radios 16 to communicate wirelessly with a server or network via a suitable protocol, such as WiFi.

The visualization system 10 can include one or more sensors 18, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 18 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 18 can capture a real-time video image of the surroundings proximate a user.

The visualization system 10 can include one or more video generation processors 20. The one or more video generation processors 20 can receive, from a server and/or a storage medium, scene data that represents a three-dimensional scene, such as a set of position coordinates for objects in the scene or a depth map of the scene. The one or more video generation processors 20 can receive one or more sensor signals from the one or more sensors 18. In response to the scene data, which represents the surroundings, and at least one sensor signal, which represents the location and/or orientation of the user with respect to the surroundings, the one or more video generation processors 20 can generate at least one video signal that corresponds to a view of the scene. In some examples, the one or more video generation processors 20 can generate two video signals, one for each eye of the user, that represent a view of the scene from a point of view of the left eye and the right eye of the user, respectively. In some examples, the one or more video generation processors 20 can generate more than two video signals and combine the video signals to provide one video signal for both eyes, two video signals for the two eyes, or other combinations.

The visualization system 10 can include one or more light sources 22 that can provide light for a display of the visualization system 10. Suitable light sources 22 can include a light-emitting diode, a monolithic light-emitting diode, a plurality of light-emitting diodes, an array of light-emitting diodes, an array of light-emitting diodes disposed on a common substrate, a segmented light-emitting diode that is disposed on a single substrate and has light-emitting diode elements that are individually addressable and controllable (and/or controllable in groups and/or subsets), an array of micro-light-emitting diodes (microLEDs), and others.

A light-emitting diode can be white-light light-emitting diode. For example, a white-light light-emitting diode can emit excitation light, such as blue light or violet light. The white-light light-emitting diode can include one or more phosphors that can absorb some or all of the excitation light and can, in response, emit phosphor light, such as yellow light, that has a wavelength greater than a wavelength of the excitation light.

The one or more light sources 22 can include light-producing elements having different colors or wavelengths. For example, a light source can include a red light-emitting diode that can emit red light, a green light-emitting diode that can emit green light, and a blue light-emitting diode that can emit blue right. The red, green, and blue light combine in specified ratios to produce any suitable color that is visually perceptible in a visible portion of the electromagnetic spectrum.

The visualization system 10 can include one or more modulators 24. The modulators 24 can be implemented in one of at least two configurations.

In a first configuration, the modulators 24 can include circuitry that can modulate the light sources 22 directly. For example, the light sources 22 can include an array of light-emitting diodes, and the modulators 24 can directly modulate the electrical power, electrical voltage, and/or electrical current directed to each light-emitting diode in the array to form modulated light. The modulation can be performed in an analog manner and/or a digital manner. In some examples, the light sources 22 can include an array of red light-emitting diodes, an array of green light-emitting diodes, and an array of blue light-emitting diodes, and the modulators 24 can directly modulate the red light-emitting diodes, the green light-emitting diodes, and the blue light-emitting diodes to form the modulated light to produce a specified image.

In a second configuration, the modulators 24 can include a modulation panel, such as a liquid crystal panel. The light sources 22 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 24 can include multiple modulation panels that can modulate different colors of light. For example, the modulators 24 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 24 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 10 can include one or more modulation processors 26, which can receive a video signal, such as from the one or more video generation processors 20, and, in response, can produce an electrical modulation signal. For configurations in which the modulators 24 directly modulate the light sources 22, the electrical modulation signal can drive the light sources 24. For configurations in which the modulators 24 include a modulation panel, the electrical modulation signal can drive the modulation panel.

The visualization system 10 can include one or more beam combiners 28 (also known as beam splitters 28), which can combine light beams of different colors to form a single multi-color beam. For configurations in which the light sources 22 can include multiple light-emitting diodes of different colors, the visualization system 10 can include one or more wavelength-sensitive (e.g., dichroic) beam splitters 28 that can combine the light of different colors to form a single multi-color beam.

The visualization system 10 can direct the modulated light toward the eyes of the viewer in one of at least two configurations. In a first configuration, the visualization system 10 can function as a projector, and can include suitable projection optics 30 that can project the modulated light onto one or more screens 32. The screens 32 can be located a suitable distance from an eye of the user. The visualization system 10 can optionally include one or more lenses 34 that can locate a virtual image of a screen 32 at a suitable distance from the eye, such as a close-focus distance, such as 500 mm, 750 mm, or another suitable distance. In some examples, the visualization system 10 can include a single screen 32, such that the modulated light can be directed toward both eyes of the user. In some examples, the visualization system 10 can include two screens 32, such that the modulated light from each screen 32 can be directed toward a respective eye of the user. In some examples, the visualization system 10 can include more than two screens 32. In a second configuration, the visualization system 10 can direct the modulated light directly into one or both eyes of a viewer. For example, the projection optics 30 can form an image on a retina of an eye of the user, or an image on each retina of the two eyes of the user.

Embodiments

Various embodiments are listed below. It will be understood that the embodiments listed below may be combined with all aspects and other embodiments in accordance with the scope of the invention.

Embodiment (a). A light-emitting diode (LED) die comprising: a plurality of pixels, each of the pixels comprising respective groups of epitaxial stacks included in a microLED comprising one or more tunnel junctions and light emitting layers of different colors, the plurality of pixels comprising: a first set of pixels configured to emit a red light; a second set of pixels configured to emit a green light; a third set of pixels configured to emit a blue light; the red light, the green light, and the blue light defining a RGB (red-green-blue) gamut; and a fourth set of pixels configured to emit a yellow light and to increase power efficiency of the device over that of a device with only RGB pixels.

Embodiment (b). The LED die of embodiment (a), wherein the yellow light comprises colors ranging from greenish-yellow to reddish-yellow.

Embodiment (c). The LED die of embodiment (a) or (b), wherein the fourth set of pixels are configured to emit an emission comprising a luminous efficacy that is higher than the first set of pixels.

Embodiment (d). The LED die of one of embodiments (a) to (c), wherein the microLED comprises: a first epitaxial stack comprising: a first active region on a first n-type layer, and a first p-type layer on the first active region; a second epitaxial stack comprising: a second active region on a second n-type layer, and a second p-type layer on the second active region; a third epitaxial stack comprising: a third active region on a third n-type layer, and a third p-type layer on the third active region; a fourth epitaxial stack comprising: a fourth active region on a fourth n-type layer, and a fourth p-type layer on the fourth active region; and a first tunnel junction adjacent to the first epitaxial stack, a second tunnel junction adjacent to the second epitaxial stack, and a third tunnel junction adjacent to the third epitaxial stack, wherein the first, second, third, and fourth epitaxial stacks are in a stacked relationship within at least one set of pixels.

Embodiment (e). The LED die of one of embodiments (a) to (d), wherein: the third epitaxial stack is above the second epitaxial stack; the second epitaxial stack is above the first epitaxial stack; the fourth epitaxial stack is above the first epitaxial stack and below the second epitaxial stack, the first and fourth epitaxial stacks being separated by the first tunnel junction, and the second and fourth epitaxial stacks being separated by the second tunnel junction; the third tunnel junction separates the second epitaxial stack and the third epitaxial stack; and the fourth epitaxial stack is configured to emit the yellow light comprising colors ranging from greenish-yellow to reddish-yellow.

Embodiment (f). The LED die of one of embodiments (a) to (e) comprising a mesa structure, wherein a portion of the first p-type layer is exposed, a portion of the second p-type layer is exposed, and a portion of the fourth p-type layer is exposed, and respective p-electrodes are limited to where light emission is required.

Embodiment (g). The LED die of one of embodiments (a) to (e) comprising a via structure, wherein the microLED further comprises: a first via for accommodating a first electrode connection from the first p-type layer, a second via for accommodating a second electrode connection from second p-type layer, a fourth via for accommodating a fourth electrode connection from the fourth p-type layer, wherein there is not a via associated with the third p-type layer.

Embodiment (h). A light-emitting diode (LED) array comprising: the LED die of one of embodiments (a) to (g) on a device substrate.

Embodiment (i). The LED array of embodiment (h), wherein the microLED comprises: a first epitaxial stack comprising: a first active region on a first n-type layer, and a first p-type layer on the first active region; a second epitaxial stack comprising: a second active region on a second n-type layer, and a second p-type layer on the second active region; a third epitaxial stack comprising: a third active region on a third n-type layer, and a third p-type layer on the third active region; a fourth epitaxial stack comprising: a fourth active region on a fourth n-type layer, and a fourth p-type layer on the fourth active region; and a first tunnel junction adjacent to the first epitaxial stack, a second tunnel junction adjacent to the second epitaxial stack, and a third tunnel junction adjacent to the third epitaxial stack, wherein the first, second, third, and fourth epitaxial stacks are in a stacked relationship within at least one set of pixels.

Embodiment (j). The LED array of embodiment (h) or (i), wherein the LED die comprises a mesa structure, wherein a portion of the first p-type layer is exposed, a portion of the second p-type layer is exposed, and a portion of the fourth p-type layer is exposed, and respective p-electrodes are limited to where light emission is required.

Embodiment (k). The LED array of embodiment (h) or (i), wherein the LED die comprises a via structure, wherein the microLED further comprises: a first via for accommodating a first electrode connection from the first p-type layer, a second via for accommodating a second electrode connection from second p-type layer, a fourth via for accommodating a fourth electrode connection from the fourth p-type layer, wherein there is not a via associated with the third p-type layer.

Embodiment (l). The LED array of one of embodiments (h) to (k) further comprising trenches between each of the pixels.

Embodiment (m). The LED array of one of embodiments (h) to (l), wherein all of the sets of pixels are integral to a monolithic substrate.

Embodiment (n). The LED array of one of embodiments (h) to (m), wherein the fourth epitaxial stack is configured to emit the yellow light comprising colors ranging from greenish-yellow to reddish-yellow.

Embodiment (o). A light-emitting diode (LED) system comprising: the LED array of one of embodiments (h) to (n); and a controller configured to control the plurality of pixels individually and/or in sets.

Embodiment (p). The LED system of embodiment (o) configured to drive less than or equal to three sets of pixels during operation.

Embodiment (q). The LED system of embodiment (o) or (p) comprising a thin film display backplane, a CMOS backplane, or CMOS microIC configured to drive each set of pixels.

Embodiment (r). A method of making a display, the method comprising: assembling an LED die according to one of embodiments (a) to (g) with a thin film display backplane, a CMOS backplane, or CMOS microIC configured to drive each set of pixels.

Embodiment(s). A method for operating a display, the method comprising: determining an image to present on the display; driving the plurality of pixels of the LED system of one of embodiments (o) to (q) to provide the image; and controlling individual and/or sets of the plurality of pixels.

Embodiment (t). The method of embodiment(s), wherein the fourth set of pixels is configured to emit an emission comprising a luminous efficacy that is higher than either of the first set of pixels.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

What is claimed is:

1. A light-emitting diode (LED) die comprising:
   a plurality of pixels, each of the pixels comprising respective groups of epitaxial stacks included in a microLED comprising one or more tunnel junctions and light emitting layers of different colors, the epitaxial stacks comprising a plurality of group III-V semiconductor layers,
   the plurality of pixels comprising:
      a first set of pixels configured to emit a red light;
      a second set of pixels configured to emit a green light;
      a third set of pixels configured to emit a blue light; the red light, the green light, and the blue light defining a RGB (red-green-blue) gamut; and
      a fourth set of pixels configured to emit a yellow light and to increase power efficiency of the device over that of a device with only RGB pixels.

2. The LED die of claim 1, wherein the yellow light comprises colors ranging from greenish-yellow to reddish-yellow.

3. The LED die of claim 1, wherein the fourth set of pixels are configured to emit an emission comprising a luminous efficacy that is higher than the first set of pixels.

4. A light-emitting diode (LED) die comprising:
   a plurality of pixels, each of the pixels comprising respective groups of epitaxial stacks included in a microLED comprising one or more tunnel junctions and light emitting layers of different colors;
   the plurality of pixels comprising:
      a first set of pixels configured to emit a red light;
      a second set of pixels configured to emit a green light;
      a third set of pixels configured to emit a blue light; the red light, the green light, and the blue light defining a RGB (red-green-blue) gamut;
      a fourth set of pixels configured to emit a yellow light and to increase power efficiency of the device over that of a device with only RGB pixels;
   a first epitaxial stack comprising: a first active region on a first n-type layer, and a first p-type layer on the first active region;
   a second epitaxial stack comprising: a second active region on a second n-type layer, and a second p-type layer on the second active region;
   a third epitaxial stack comprising: a third active region on a third n-type layer, and a third p-type layer on the third active region;
   a fourth epitaxial stack comprising: a fourth active region on a fourth n-type layer, and a fourth p-type layer on the fourth active region; and a first tunnel junction adjacent to the first epitaxial stack, a second tunnel junction adjacent to the second epitaxial stack, and a third tunnel junction adjacent to the third epitaxial stack, wherein the first, second, third, and fourth epitaxial stacks are in a stacked relationship within at least one set of pixels.

5. The LED die of claim 4, wherein:

the third epitaxial stack is above the second epitaxial stack;

the second epitaxial stack is above the first epitaxial stack;

the fourth epitaxial stack is above the first epitaxial stack and below the second epitaxial stack, the first and fourth epitaxial stacks being separated by the first tunnel junction, and the second and fourth epitaxial stacks being separated by the second tunnel junction;

the third tunnel junction separates the second epitaxial stack and the third epitaxial stack; and the fourth epitaxial stack is configured to emit the yellow light comprising colors ranging from greenish-yellow to reddish-yellow.

6. The LED die of claim 4 comprising a mesa structure, wherein a portion of the first p-type layer is exposed, a portion of the second p-type layer is exposed, and a portion of the fourth p-type layer is exposed, and respective p-electrodes are limited to where light emission is required.

7. The LED die of claim 4 comprising a via structure, wherein the microLED further comprises: a first via for accommodating a first electrode connection from the first p-type layer, a second via for accommodating a second electrode connection from second p-type layer, a fourth via for accommodating a fourth electrode connection from the fourth p-type layer, wherein there is not a via associated with the third p-type layer.

8. A light-emitting diode (LED) system comprising: the LED array of claim 1; and a controller configured to control the plurality of pixels individually and/or in sets.

9. The LED system of claim 8 configured to drive less than or equal to three sets of pixels during operation.

10. The LED system of claim 8 comprising a thin film display backplane, a CMOS backplane, or CMOS microIC configured to drive each set of pixels.

11. A method for operating a display, the method comprising:

determining an image to present on the display;

driving the plurality of pixels of the LED system of claim 8 to provide the image; and controlling individual and/or sets of the plurality of pixels.

12. The method of claim 11, wherein the fourth set of pixels is configured to emit an emission comprising a luminous efficacy that is higher than the first set of pixels.

13. A method of making a display, the method comprising: assembling an LED die according to claim 1 with a thin film display backplane, a CMOS backplane, or CMOS microIC configured to drive each set of pixels.

14. A light-emitting diode (LED) die on a device substrate comprising:

a plurality of pixels, each of the pixels comprising respective groups of epitaxial stacks included in a microLED comprising one or more tunnel junctions and light emitting layers of different colors;

the plurality of pixels comprising:

a first set of pixels configured to emit a red light;

a second set of pixels configured to emit a green light;

a third set of pixels configured to emit a blue light; the red light, the green light, and the blue light defining a RGB (red-green-blue) gamut;

a fourth set of pixels configured to emit a yellow light and to increase power efficiency of the device over that of a device with only RGB pixels;

a first epitaxial stack comprising: a first active region on a first n-type layer, and a first p-type layer on the first active region;

a second epitaxial stack comprising: a second active region on a second n-type layer, and a second p-type layer on the second active region;

a third epitaxial stack comprising: a third active region on a third n-type layer, and a third p-type layer on the third active region;

a fourth epitaxial stack comprising: a fourth active region on a fourth n-type layer, and a fourth p-type layer on the fourth active region; and a first tunnel junction adjacent to the first epitaxial stack, a second tunnel junction adjacent to the second epitaxial stack, and a third tunnel junction adjacent to the third epitaxial stack, wherein the first, second, third, and fourth epitaxial stacks are in a stacked relationship within at least one set of pixels.

15. The LED array of claim 14, wherein the LED die comprises a mesa structure, wherein a portion of the first p-type layer is exposed, a portion of the second p-type layer is exposed, and a portion of the fourth p-type layer is exposed, and respective p-electrodes are limited to where light emission is required.

16. The LED array of claim 14, wherein the LED die comprises a via structure, wherein the microLED further comprises: a first via for accommodating a first electrode connection from the first p-type layer, a second via for accommodating a second electrode connection from second p-type layer, a fourth via for accommodating a fourth electrode connection from the fourth p-type layer, wherein there is not a via associated with the third p-type layer.

17. The LED array of claim 14 further comprising trenches between each of the pixels.

18. The LED array of claim 14, wherein all of the sets of pixels are integral to a monolithic substrate.

19. The LED array of claim 14, wherein the fourth epitaxial stack is configured to emit the yellow light comprising colors ranging from greenish-yellow to reddish-yellow.

* * * * *